United States Patent
Komura et al.

(10) Patent No.: US 9,812,507 B2
(45) Date of Patent: Nov. 7, 2017

(54) SEMICONDUCTOR MEMORY DEVICE

(71) Applicant: TOSHIBA MEMORY CORPORATION, Minato-ku, Tokyo (JP)

(72) Inventors: Masanori Komura, Mie (JP); Takeshi Takagi, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/227,493

(22) Filed: Aug. 3, 2016

(65) Prior Publication Data

US 2017/0263682 A1 Sep. 14, 2017

Related U.S. Application Data

(60) Provisional application No. 62/306,984, filed on Mar. 11, 2016.

(51) Int. Cl.
*H01L 27/24* (2006.01)
*H01L 45/00* (2006.01)
*H01L 23/528* (2006.01)

(52) U.S. Cl.
CPC ......... *H01L 27/249* (2013.01); *H01L 23/528* (2013.01); *H01L 45/08* (2013.01); *H01L 45/1233* (2013.01); *H01L 45/146* (2013.01)

(58) Field of Classification Search
CPC ..... H01L 27/249; H01L 23/528; H01L 45/08; H01L 45/1233; H01L 45/146
USPC ........................................ 257/4, 2; 438/282
See application file for complete search history.

(56) References Cited

U.S. PATENT DOCUMENTS

| | | | |
|---|---|---|---|
| 8,124,968 B2 | 2/2012 | Koo et al. | |
| 8,258,038 B2 | 9/2012 | Nozawa | |
| 8,299,571 B2 | 10/2012 | Ozawa et al. | |
| 8,406,034 B2 | 3/2013 | Murooka | |
| 2010/0219392 A1 | 9/2010 | Awaya et al. | |
| 2013/0250658 A1* | 9/2013 | Wei .................. | H01L 45/08 365/148 |
| 2015/0083989 A1 | 3/2015 | Ode et al. | |

(Continued)

FOREIGN PATENT DOCUMENTS

| | | |
|---|---|---|
| JP | 2010-010688 A | 1/2010 |
| JP | 2010-287872 A | 12/2010 |
| JP | 5558090 B2 | 6/2011 |

(Continued)

*Primary Examiner* — Cuong Q Nguyen
*Assistant Examiner* — Tong-Ho Kim
(74) *Attorney, Agent, or Firm* — Foley & Lardner LLP

(57) ABSTRACT

A semiconductor memory device according to an embodiment comprises: a semiconductor substrate which extends in first and second directions; first wiring lines which are arranged in a third direction, and which extend in the first direction; second wiring lines which are arranged in the first direction and extend in the third direction; and memory cells disposed at intersections of the first wiring lines and the second wiring lines, one of the memory cells including a first film and a second film whose permittivity is different from that of the first film which are stacked in the second direction between one of the first wiring lines and one of the second wiring lines, and the second films of two of the memory cells adjacent in the third direction being separated between the two memory cells.

18 Claims, 17 Drawing Sheets

(56) References Cited

U.S. PATENT DOCUMENTS

2015/0255512 A1* 9/2015 Takagi .................. H01L 45/146
257/4

FOREIGN PATENT DOCUMENTS

| JP | 4763858 B2 | 8/2011 |
| JP | 5508944 B2 | 12/2011 |
| JP | 2015-061078 A | 3/2015 |

* cited by examiner

SEMICONDUCTOR MEMORY DEVICE

CROSS-REFERENCE TO RELATED APPLICATIONS

This application is based upon and claims the benefit of priority from the prior U.S. Provisional Application 62/306,984, filed on Mar. 11, 2016, the entire contents of which are incorporated herein by reference.

BACKGROUND

Field

Embodiments of the present invention relate to a semiconductor memory device and a method of manufacturing the same.

Description of the Related Art

A flash memory is a semiconductor memory device known for its low cost and large capacity. One example of a semiconductor memory device to replace the flash memory is a variable resistance type memory (ReRAM: Resistance RAM) which employs a variable resistance film in its memory cell. The ReRAM can configure a cross-point type memory cell array, hence can achieve an increased capacity similarly to the flash memory. Moreover, in order to further increase capacity, there is also being developed a ReRAM having a so-called VBL (Vertical Bit Line) structure in which bit lines which are selection wiring lines are arranged in a perpendicular direction to a semiconductor substrate.

DETAILED DESCRIPTION

A semiconductor memory device according to an embodiment comprises: a semiconductor substrate which extends in first and second directions that intersect each other; a plurality of first wiring lines which are arranged in a third direction that intersects the first direction and the second direction, and which extend in the first direction; a plurality of second wiring lines which are arranged in the first direction and extend in the third direction; and a plurality of memory cells disposed at intersections of the first wiring lines and the second wiring lines, one of the memory cells including a first film and a second film whose permittivity is different from that of the first film which are stacked in the second direction between one of the first wiring lines and one of the second wiring lines, and the second films of two of the memory cells adjacent in the third direction being separated between the two memory cells.

Semiconductor memory devices according to embodiments will be described below with reference to the drawings.

First Embodiment

First, an overall configuration of a semiconductor memory device according to a first embodiment will be described.

Figure 1:
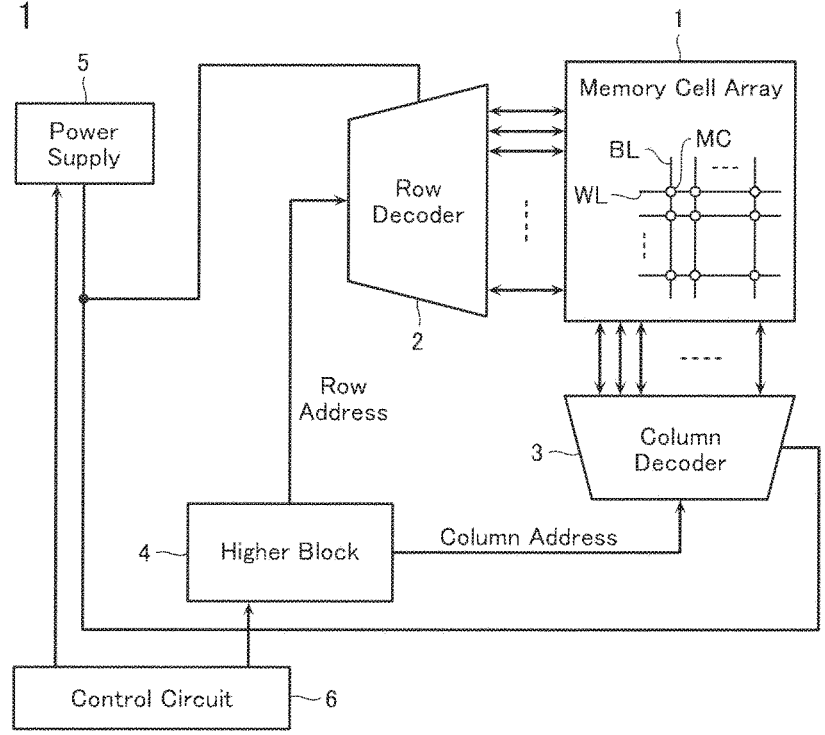
FIG. 1 is a view showing functional blocks of a semiconductor memory device according to a first embodiment.

FIG. 1 is a view showing functional blocks of the semiconductor memory device according to the present embodiment.

As shown in FIG. 1, the semiconductor memory device of the present embodiment comprises: a memory cell array 1; a row decoder 2; a column decoder 3; a higher block 4; a power supply 5; and a control circuit 6.

The memory cell array 1 includes: a plurality of word lines WL and a plurality of bit lines BL; and a plurality of memory cells MC selected by these word lines WL and bit lines BL. The row decoder 2 selects the word line WL during an access operation. The column decoder 3 selects the bit line BL during an access operation, and includes a driver that controls the access operation. The higher block 4 selects the memory cell MC which is to be an access target in the memory cell array 1. The higher block 4 provides a row address and a column address to, respectively, the row decoder 2 and the column decoder 3. The power supply 5, during write/read of data, generates certain combinations of voltages corresponding to respective operations, and supplies these combinations of voltages to the row decoder 2 and the column decoder 3. The control circuit 6 performs control of the likes of sending the addresses to the higher block 4, and, moreover, performs control of the power supply 5, based on a command from external.

Next, an outline of the memory cell array 1 will be described. Hereafter, the memory cell array 1 of the present embodiment will sometimes also be distinguished from another embodiment and be described assigned with a reference symbol 100.

Figure 2:
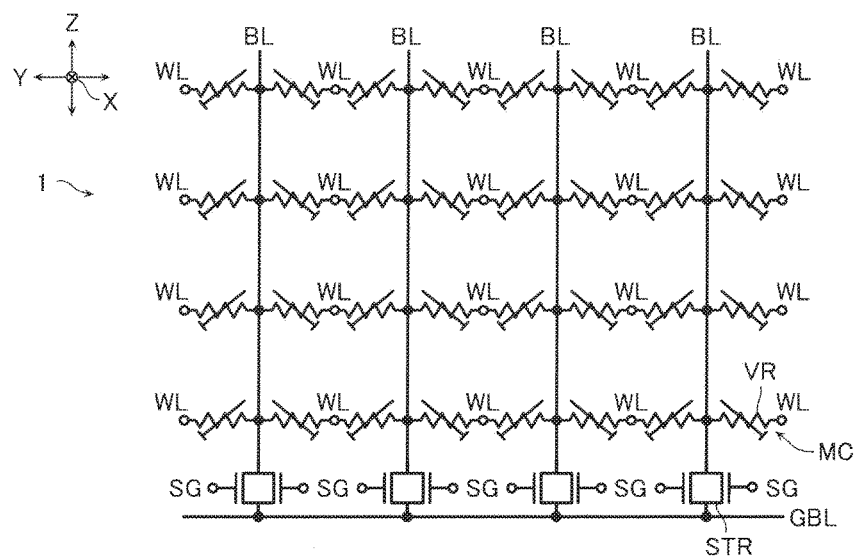
FIG. 2 is a circuit diagram of a memory cell array of the semiconductor memory device according to the same embodiment.

FIG. 2 is a circuit diagram of the memory cell array of the semiconductor memory device according to the present embodiment.

As shown in FIG. 2, the memory cell array 1 includes: the plurality of word lines WL extending in an X direction; the plurality of bit lines BL extending in a Z direction; and the plurality of memory cells MC disposed at intersections of the plurality of word lines WL and the plurality of bit lines BL. In addition, the memory cell array 1 includes a plurality of global bit lines GBL. The bit lines BL arranged in a Y direction, of the plurality of bit lines BL, are commonly connected to one of the global bit lines GEL via a select transistor STR. Each of the select transistors STR is controlled by a select gate line SG.

Next, a structure of the memory cell array 100 will be described.

Figure 3:
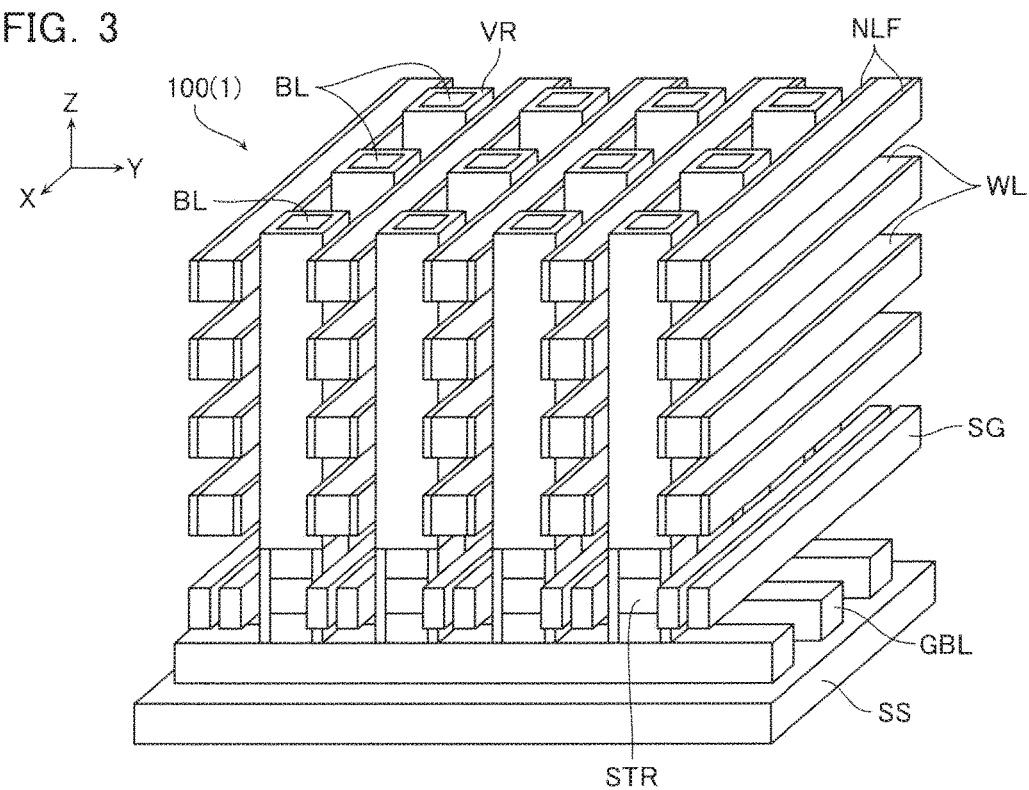
FIG. 3 is a schematic perspective view of the memory cell array of the semiconductor memory device according to the same embodiment.
Figure 4:
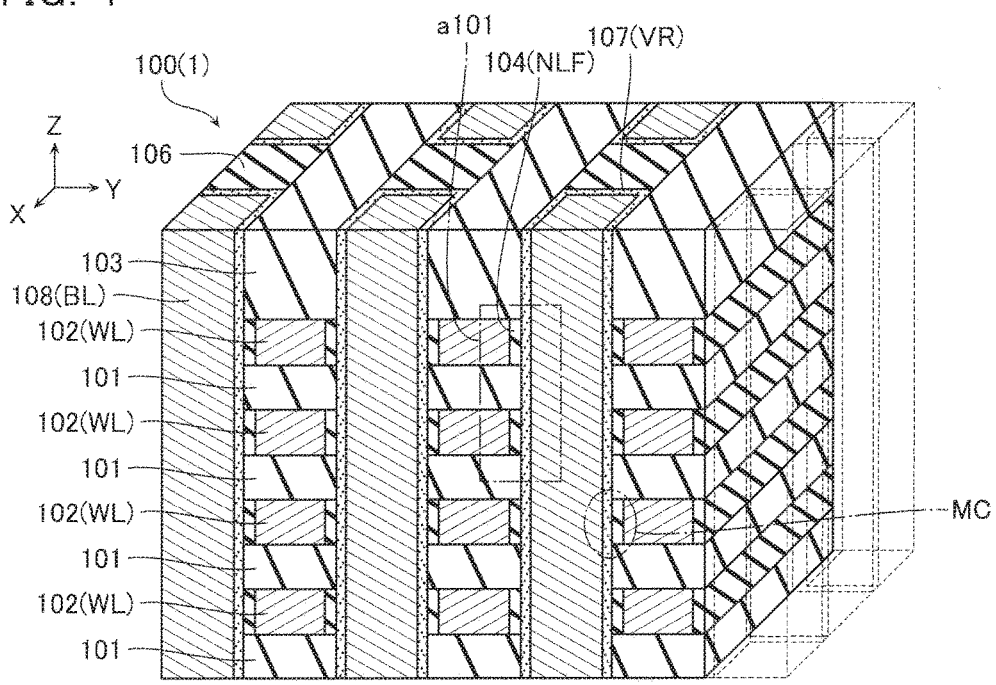
FIG. 4 is a perspective view of the memory cell array of the semiconductor memory device according to the same embodiment.

FIGS. 3 and 4 are perspective views of the memory cell array of the semiconductor memory device according to the present embodiment. FIG. 3 is a structure omitting the likes of an inter-layer insulating film between wiring lines; and FIG. 4 is a structure more upward than the select transistor STR. In addition, FIG. 5 is a cross-sectional view in the Y-Z directions of a memory cell periphery of the memory cell array of the same semiconductor memory device, and is an enlargement of a region a101 shown by the dot-chain line of FIG. 4.

As shown in FIG. 3, the memory cell array 100 has a so-called VBL (Vertical Bit Line) structure in which the bit line BL extends perpendicularly to a principal plane of a semiconductor substrate SS. In other words, the plurality of word lines WL are arranged in a matrix in the Y direction and the Z direction, and each extend in the X direction. The plurality of bit lines BL are arranged in a matrix in the X direction and the Y direction, and extend in the Z direction. Moreover, each of the memory cells MC is disposed at each of the intersections of these plurality of word lines WL and plurality of bit lines BL. In other words, the plurality of memory cells MC are arranged in a three-dimensional matrix in the X direction, the Y direction, and the Z direction. Now, the word line WL is formed by titanium nitride (TiN) or tungsten (W), for example. The bit line BL is formed by polysilicon (Poly-Si), for example.

The plurality of global bit lines GBL are disposed between the semiconductor substrate SS and the plurality of bit lines BL. The plurality of global bit lines GBL are arranged in the X direction and extend in the Y direction. In addition, the select transistor STR is disposed at each of lower ends of the plurality of bit lines BL. These select transistors STR are controlled by a plurality of the select gate lines SG arranged in the Y direction and extending in the X direction. In the case of FIG. 3, a plurality of the select transistors STR arranged in the X direction are controlled by one select gate line SG, while the select transistors STR arranged in the Y direction are controlled separately.

Figure 5:
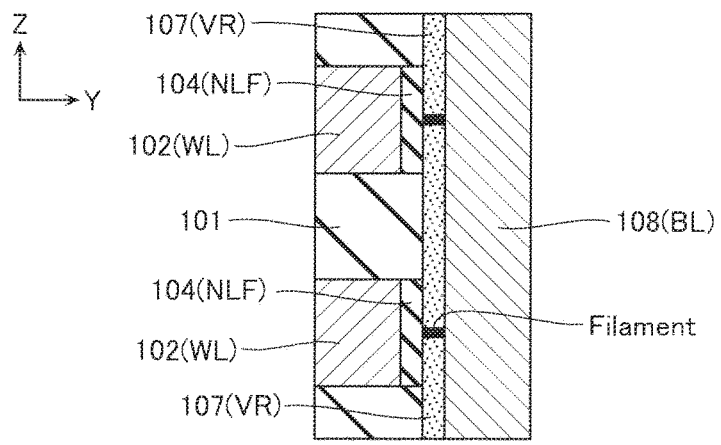
FIG. 5 is a cross-sectional view of a memory cell periphery of the memory cell array of the semiconductor memory device according to the same embodiment.

As shown in FIGS. 3 to 5, the memory cell MC includes: a variable resistance film VR; and a nonlinearity film NLF for providing nonlinearity to the memory cell MC. Now, the variable resistance film VR is formed by a material whose resistance value changes electrically, and is formed by a metal oxide such as hafnium oxide ($HfO_2$), zirconium oxide ($ZrO_2$), tungsten oxide ($WO_2$), tantalum oxide ($Ta_2O_5$), or aluminum oxide ($Al_2O_3$), for example. On the other hand, the nonlinearity film NLF may be formed by the likes of titanium oxide ($TiO_2$), tantalum oxide ($Ta_2O_5$), amorphous silicon (a-Si), silicon nitride (SiN), niobium oxide ($NbO_2$), or an intermetallic compound GeSbTe, for example, or may be formed by a stacked structure of metal-insulator-metal (hereafter, called "MIM structure") in which these titanium oxide ($TiO_2$), and so on, are sandwiched by titanium nitride (TiN).

The variable resistance film VR is disposed so as to cover four side surfaces facing the X direction and the Y direction of the bit line BL. Note that the variable resistance film VR may be disposed separated only on both side surfaces facing the Y direction of the bit line BL, or may be disposed separated at each intersection of the word line WL and the bit line BL. On the other hand, the nonlinearity film NLF is disposed along each of the word lines WL on both side surfaces facing the Y direction of each of the word lines WL, on a word line WL basis. In other words, the nonlinearity film NLF has a structure separated between two of the memory cells MC adjacent in the Z direction.

Next, operations of the memory cell array 1 will be simply described.

The variable resistance film VR undergoes transition between a high-resistance state and a low-resistance state, based on an applied voltage. The memory cell MC stores data in a nonvolatile manner by a resistance state of this variable resistance film VR. The variable resistance film VR generally has: a setting operation where it undergoes transition from the high-resistance state (reset state) to the low-resistance state (set state); and a resetting operation where it undergoes transition from the low-resistance state (set state) to the high-resistance state (reset state). In addition, the variable resistance film VR has a forming operation required only immediately after manufacturing. As shown in FIG. 5, this forming operation is an operation in which a region (filament path) where locally it is easy for a current to flow is formed in the variable resistance film VR. The forming operation is executed by applying both ends of the variable resistance film VR with a voltage which is higher than an applied voltage employed during the setting operation and the resetting operation.

Next, advantages of the memory cell array 100 having the above-described structure will be described using a comparative example. Employed here as the comparative example will be a memory cell array having a structure in which the nonlinearity films NLF of the memory cells MC arranged in the Z direction are formed integrally.

In the case of providing the memory cell MC with the nonlinearity film NLF, switching characteristics of the memory cell MC can be provided. In many cases, this nonlinearity film NLF employs a film whose permittivity is higher than that of the variable resistance film VR in order to prevent insulation breakdown from occurring during the forming operation. However, such a high permittivity film has a narrow band gap, hence a current leak easily occurs.

In this respect, when the nonlinearity films NLF are formed integrally between the memory cells MC arranged in the Z direction as in the comparative example, it is a problem that a leak current between these memory cells MC via this nonlinearity film NLF ends up increasing. In contrast, in the case of the present embodiment, as previously mentioned, the nonlinearity film NLF is separated between the memory cells MC arranged in the Z direction, hence a current leak between these memory cells MC via the nonlinearity films NLF can be avoided.

Figure 6:
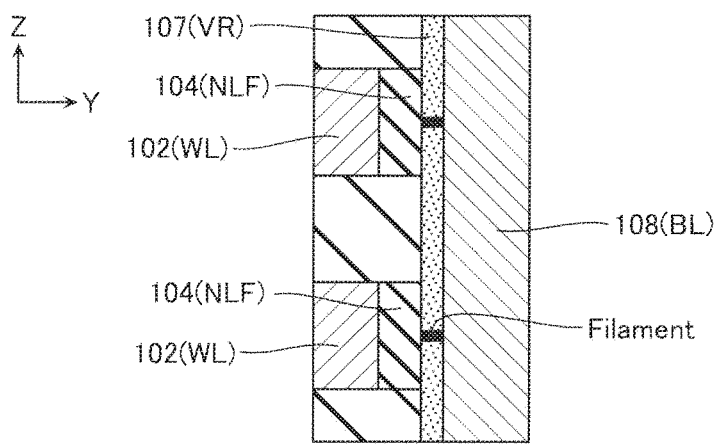
FIGS. 6 and 7 are other cross-sectional views of the memory cell periphery of the memory cell array of the semiconductor memory device according to the same embodiment.
Figure 7:
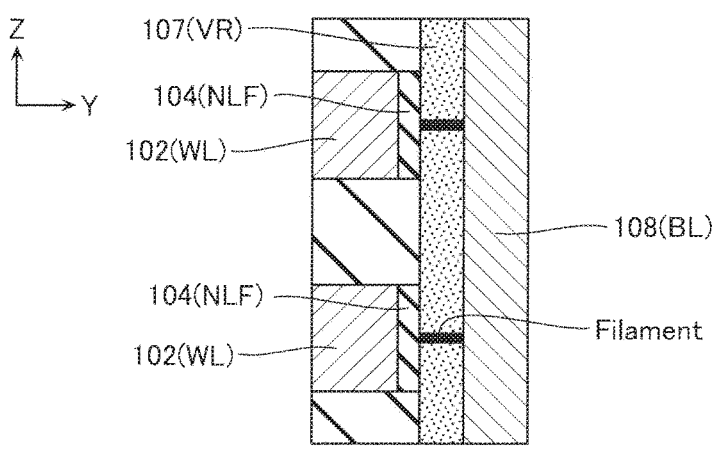

Note that in the case of FIG. 5, the nonlinearity film NLF is shown with about the same film thickness as the variable resistance film VR, but the present embodiment is not limited to this. For example, when it is desired to more certainly avoid insulation breakdown during the forming operation, it is also possible for the nonlinearity film NLF to be made thicker than the variable resistance film VR as in FIG. 6. Moreover, when permittivity of the nonlinearity film NLF is high with respect to the variable resistance film VR and, during the forming operation, the nonlinearity film NLF is only applied with an electric field insufficient for insulation breakdown to occur, it is also possible for the nonlinearity film NLF to be made thinner than the variable resistance film VR as in FIG. 7.

Next, manufacturing steps of the memory cell array 100 will be described.

FIGS. 8 to 22 are perspective views describing the manufacturing steps of the memory cell array of the semiconductor memory device according to the present embodiment.

Figure 8:
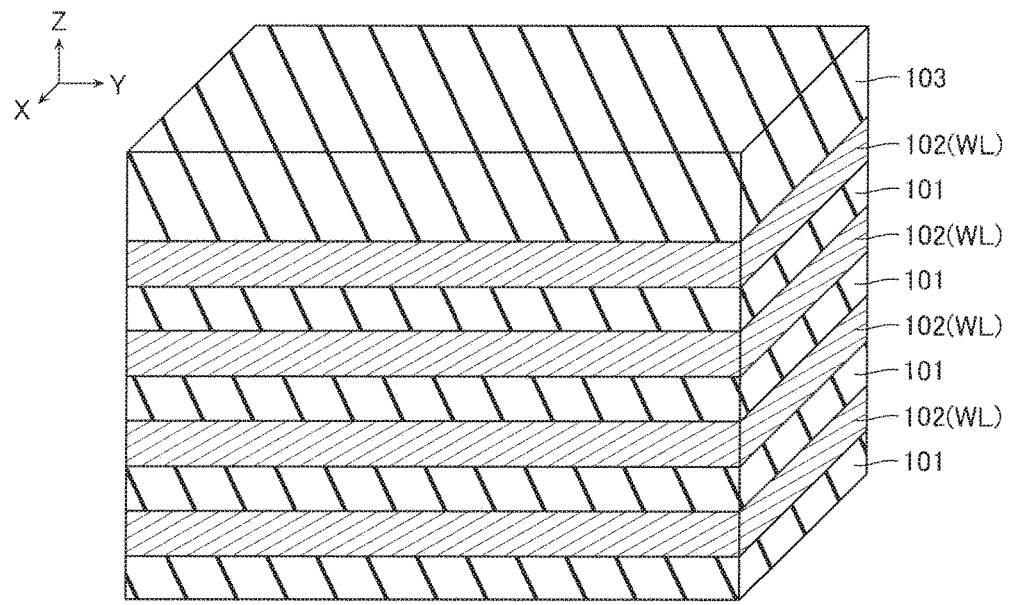
FIGS. 8 to 22 are perspective views describing manufacturing steps of the memory cell array of the semiconductor memory device according to the same embodiment.

First, a plurality of inter-layer insulating films 101 and conductive films 102 are stacked alternately on an unillustrated semiconductor substrate. Then, as shown in FIG. 8, an inter-layer insulating film 103 is stacked on the uppermost layer conductive film 102. Now, the inter-layer insulating films 101 and 103 are formed by silicon oxide ($SiO_2$), for example. The conductive film 102 is formed by titanium nitride (TiN) or tungsten (W), for example, and functions as the word line WL.

Next, a resist film 141 having a pattern of the plurality of word lines WL extending in the X direction, is deposited on the inter-layer insulating film 103.

Figure 10:
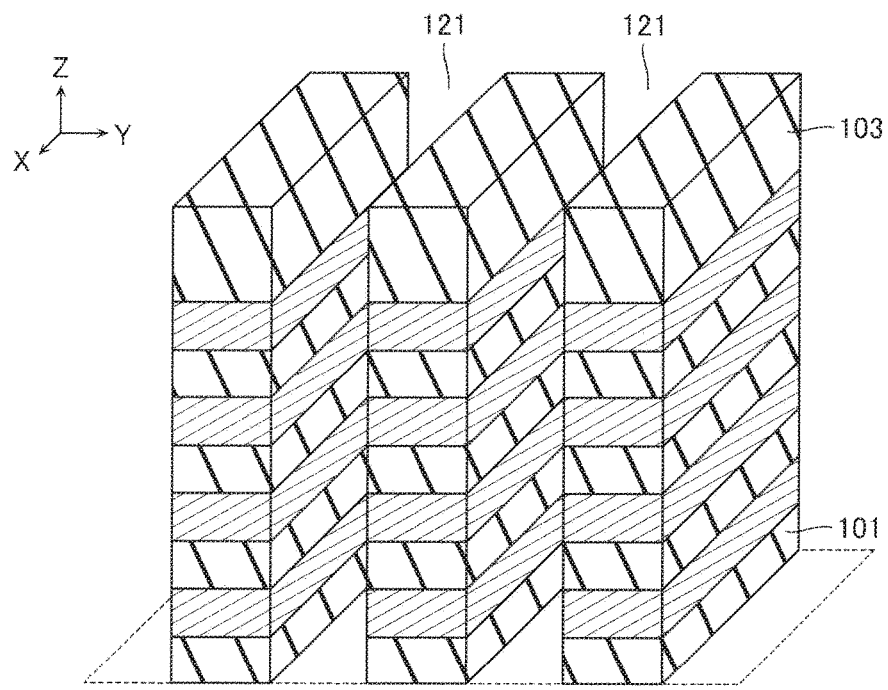

Then, as shown in FIG. 10, a trench 121 reaching from an upper surface of the inter-layer insulating film 103 to a bottom surface of the lowermost layer inter-layer insulating film 101, is formed by anisotropic etching using the resist film 141.

Figure 11:
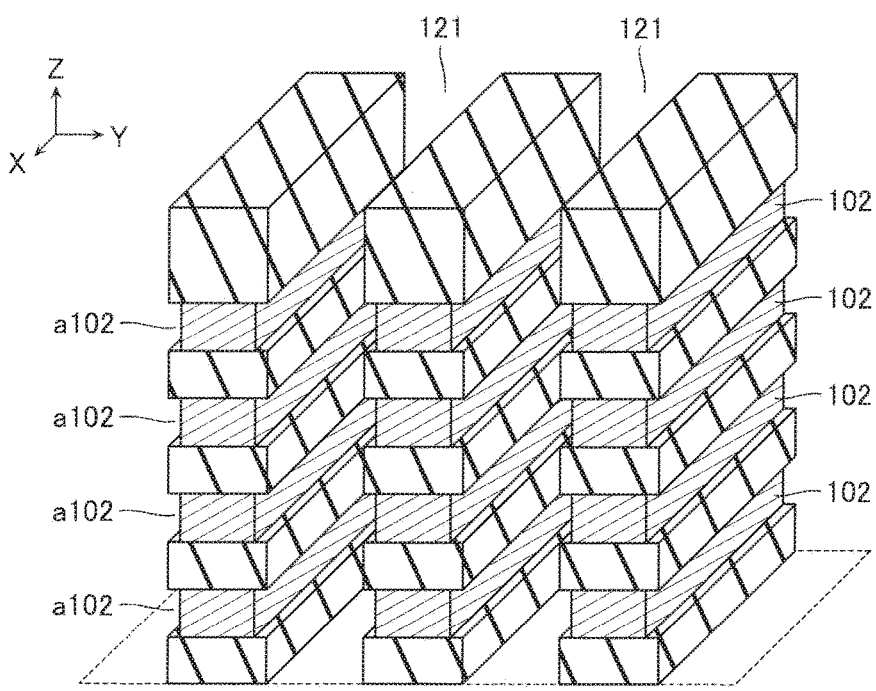

Next, as shown in FIG. 11, an end (a place a102) of the conductive film 102 exposed in the trench 121 is recessed only as much as a film thickness of the nonlinearity film NLF, by isotropic etching via the trench 121.

Figure 12:
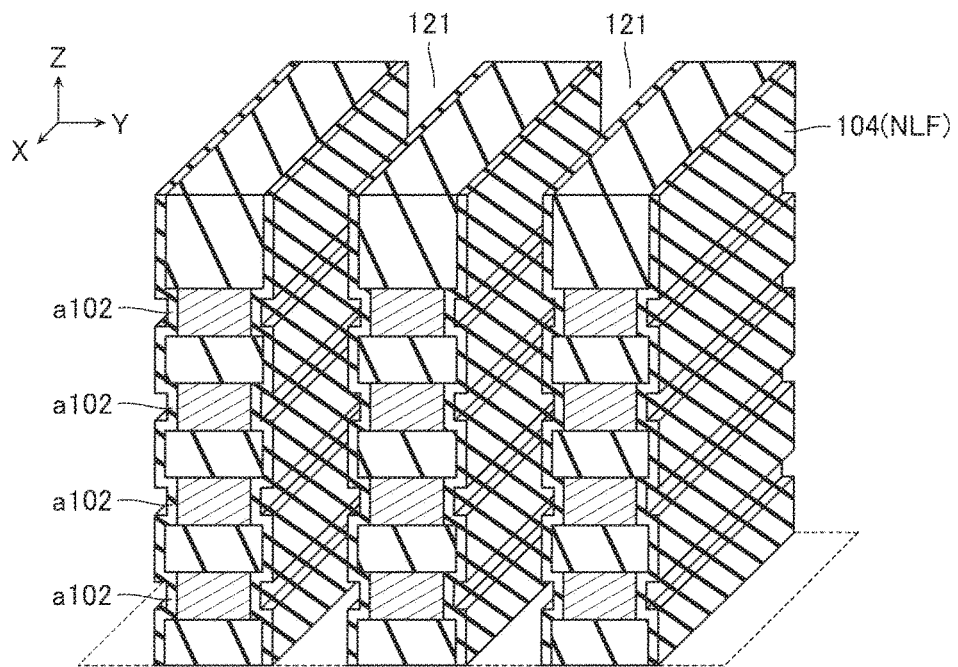

Then, as shown in FIG. 12, a high permittivity insulating film 104 is deposited on a side surface of the trench 121, and the high permittivity insulating film 104 is implanted in the place a102. Now, the high permittivity insulating film 104 is formed by titanium oxide ($TiO_2$), for example, and functions as the nonlinearity film NLF.

Figure 13:
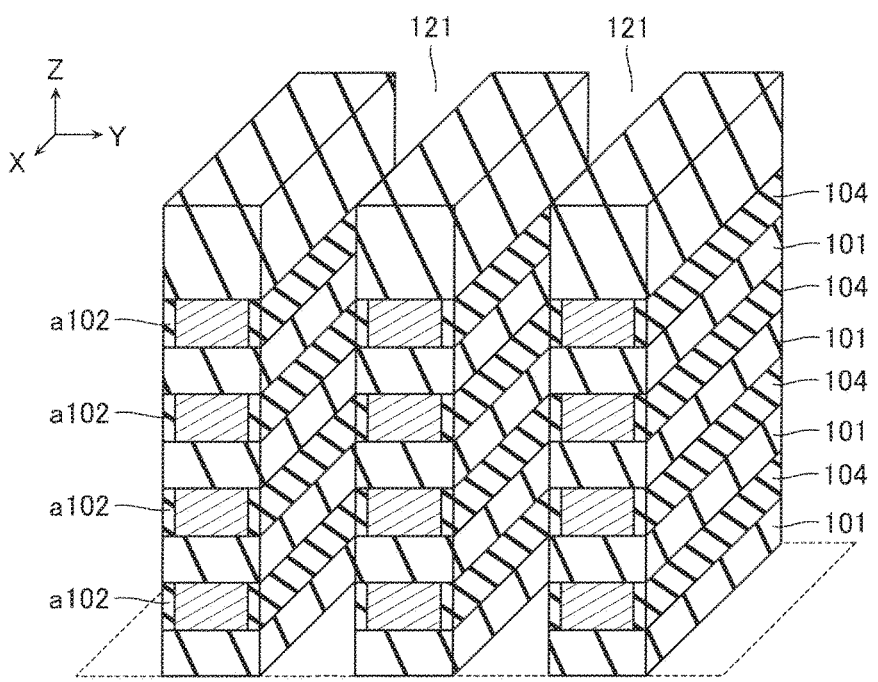

Next, as shown in FIG. 13, the high permittivity insulating film 104 is removed excluding a portion implanted in the place a102, by anisotropic etching via the trench 121. As a result, the high permittivity insulating film 104 is separated at a position of the inter-layer insulating film 101.

Figure 14:
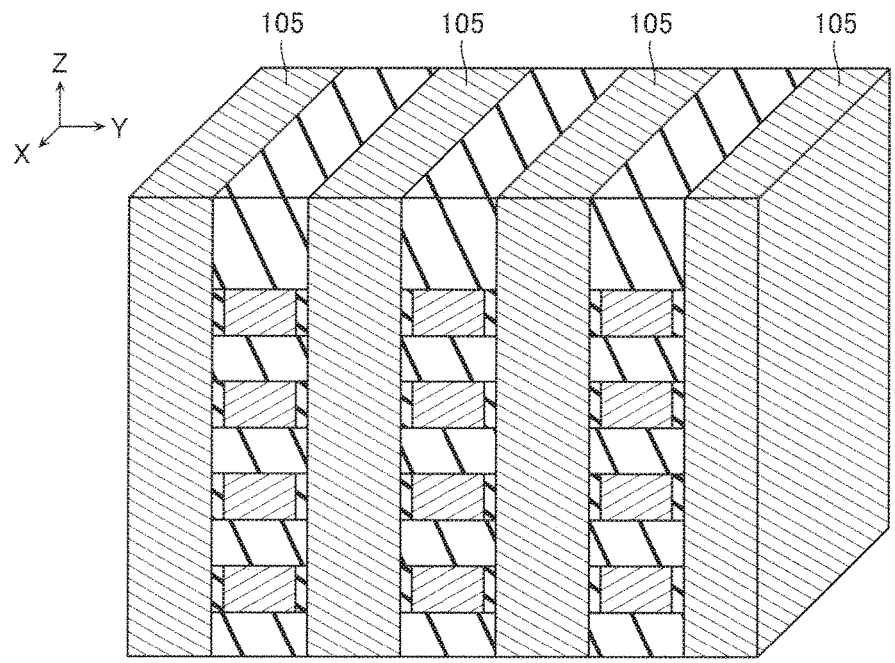

Then, as shown in FIG. 14, a conductive film 105 is implanted in the trench 121. Now, the conductive film 105 is formed by polysilicon (Poly-Si), for example.

Figure 15:
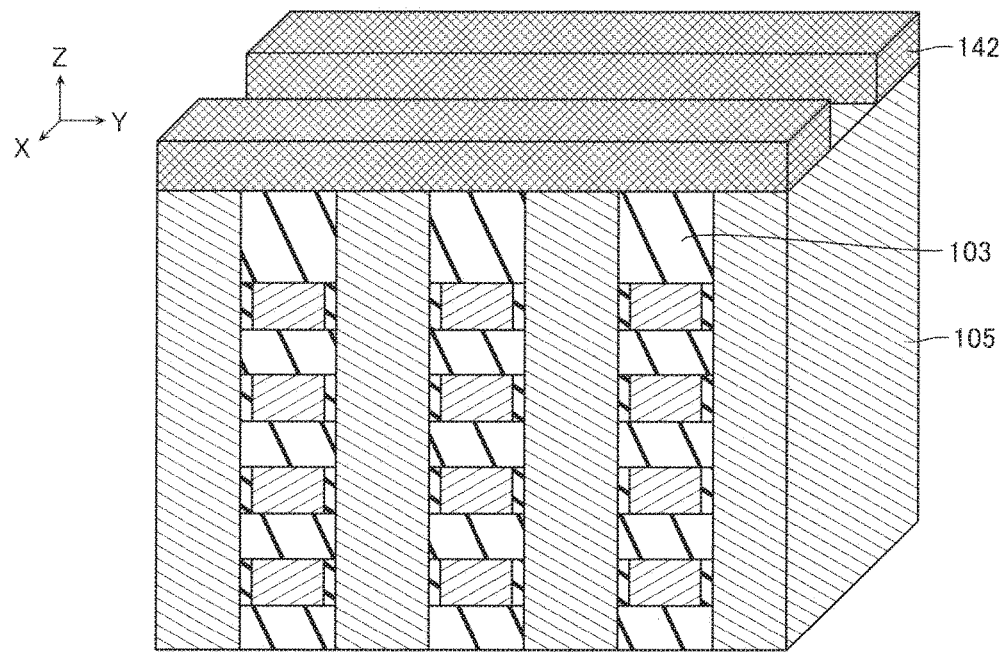

Next, as shown in FIG. 15, a resist film 142 having a pattern of lines/spaces arranged in the X direction for leaving the plurality of bit lines BL, is deposited on the inter-layer insulating film 103 and the conductive film 105.

Figure 16:
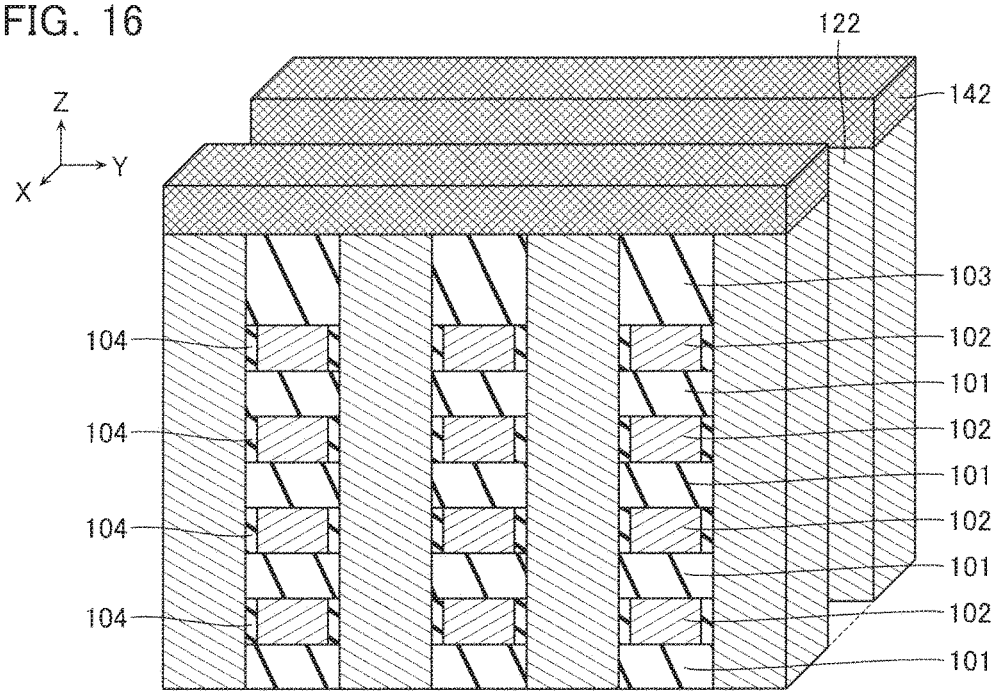

Then, as shown in FIG. 16, a trench 122 is formed in the conductive film 105 not appearing in FIG. 16, from its upper surface to its bottom surface, while leaving the inter-layer insulating film 101, the conductive film 102, the inter-layer insulating film 103, and the high permittivity insulating film 104, by anisotropic etching using the resist film 142.

Figure 17:
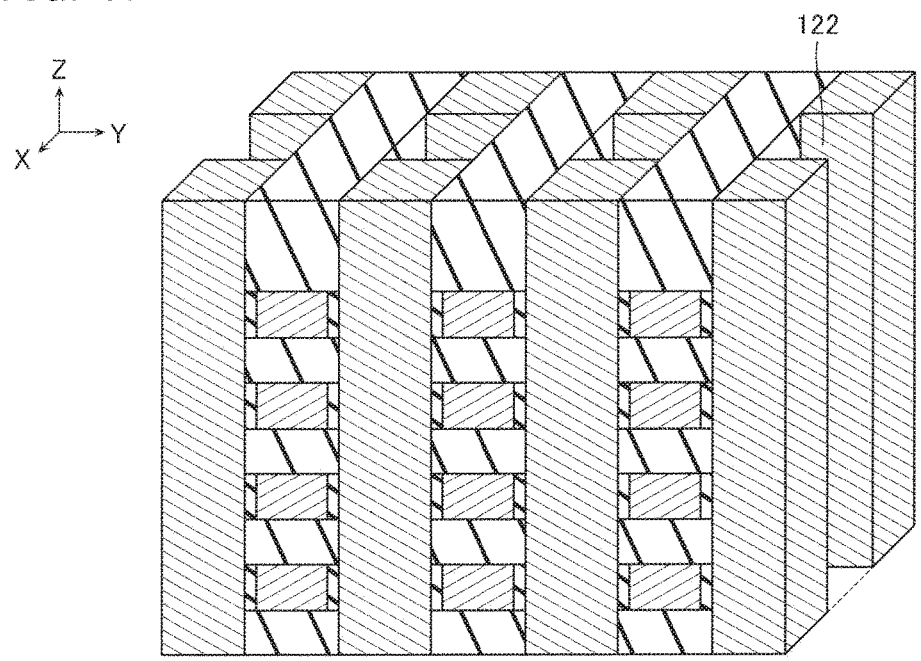

Next, as shown in FIG. 17, the resist film 142 is removed.

Figure 18:
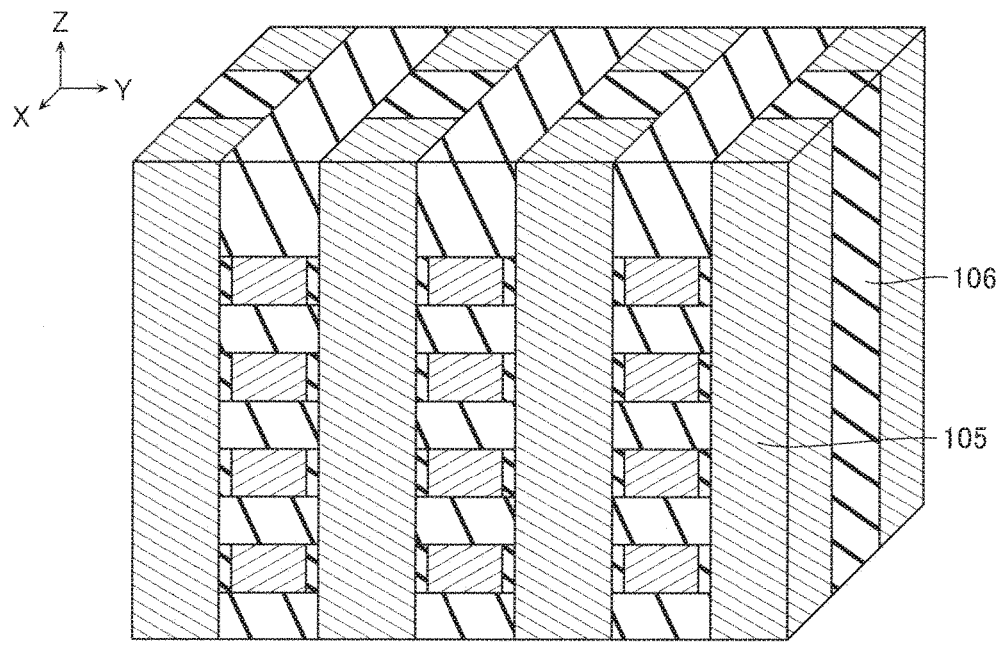

Then, an insulating film 106 is implanted in the trench 122. Next, as shown in FIG. 18, an upper surface of the insulating film 106 undergoes smoothing by CMP (Chemical Mechanical Polishing), and the conductive film 105 is exposed. Now, the insulating film 106 is formed by silicon oxide ($SiO_2$), for example.

Figure 19:
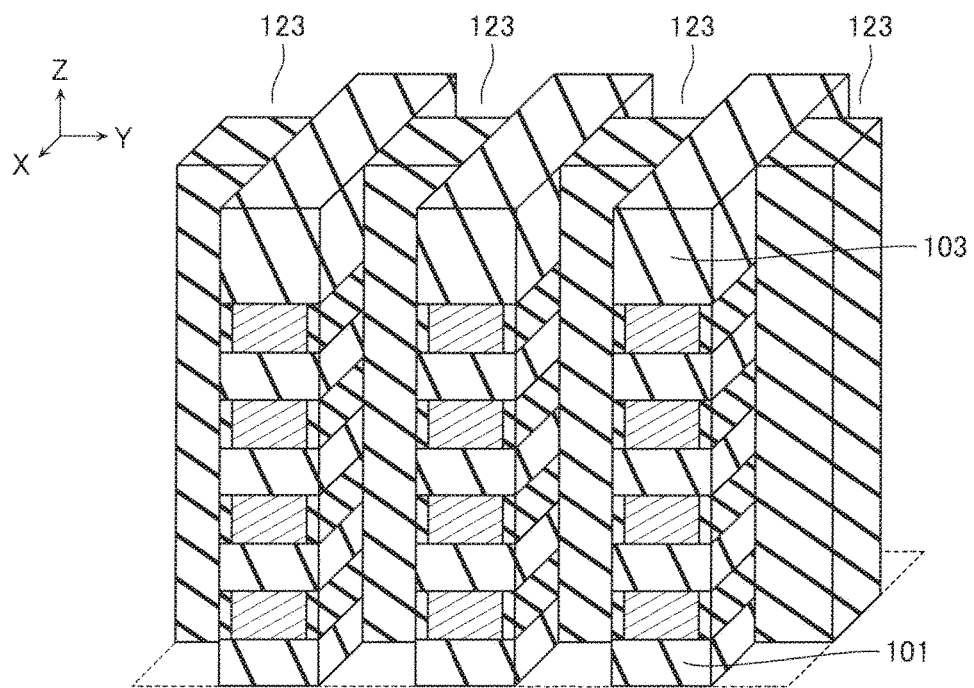

Then, as shown in FIG. 19, the conductive film 105 is removed and a trench 123 reaching from a position of the upper surface of the inter-layer insulating film 103 to a position of the bottom surface of the lowermost layer inter-layer insulating film 101 is formed, by wet etching.

Figure 20:
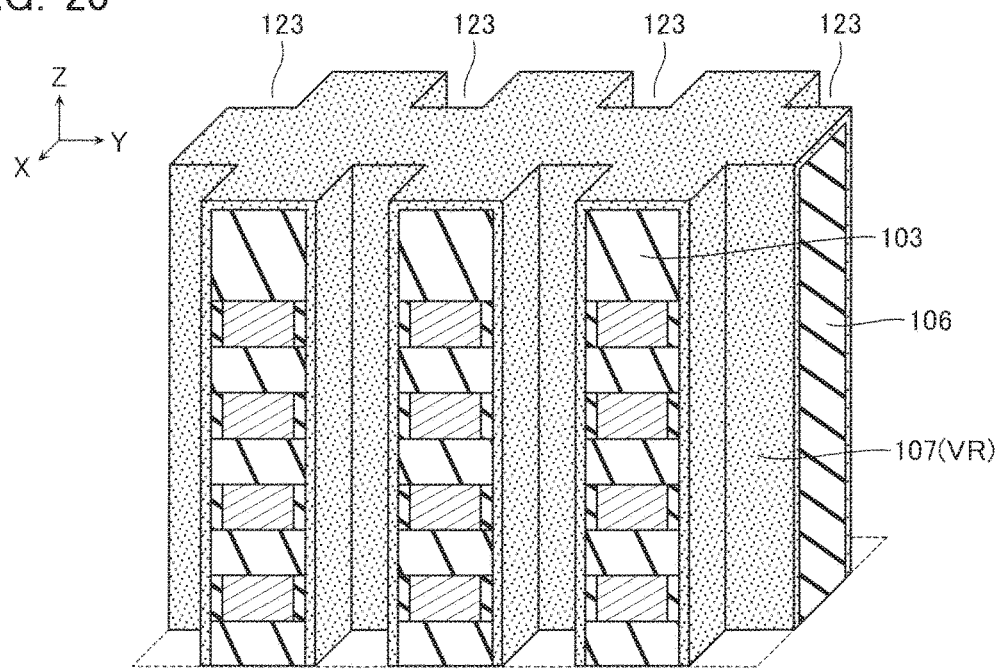

Next, as shown in FIG. 20, a variable resistance film 107 covering the upper surface of the inter-layer insulating film 103, an upper surface of the insulating film 106, and a side surface of the trench 123, is deposited. Now, the variable resistance film 107 is formed by a metal oxide such as hafnium oxide ($HfO_2$), for example, and functions as the variable resistance film VR.

Figure 21:
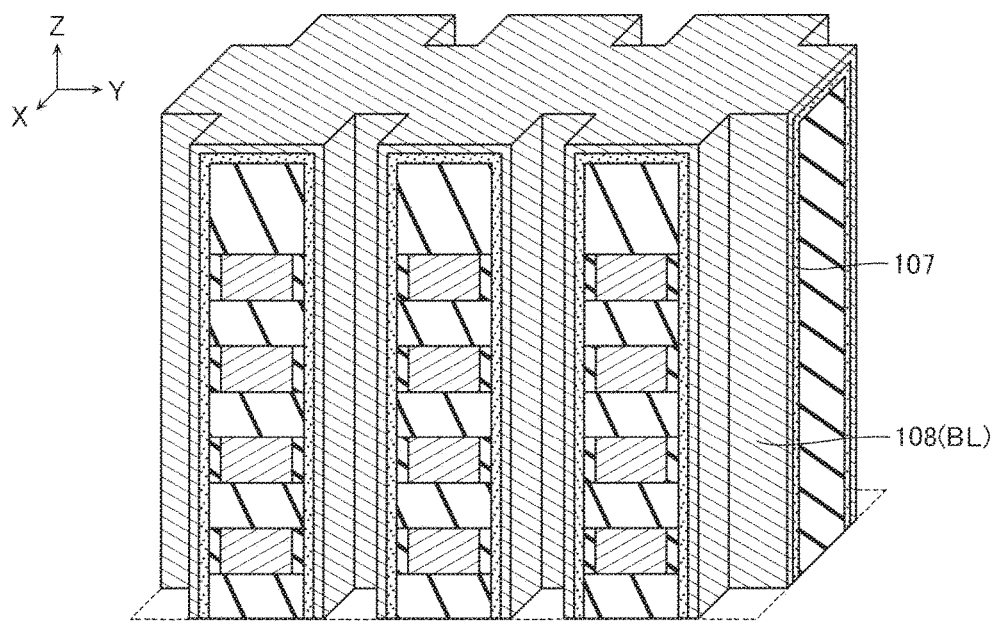

Then, as shown in FIG. 21, a conductive film 108 covering a surface of the variable resistance film 107 is deposited. Now, the conductive film 108 is formed by polysilicon (Poly-Si) including an impurity in high concentration or by a metal, for example, and functions as part of the bit line BL.

Figure 22:
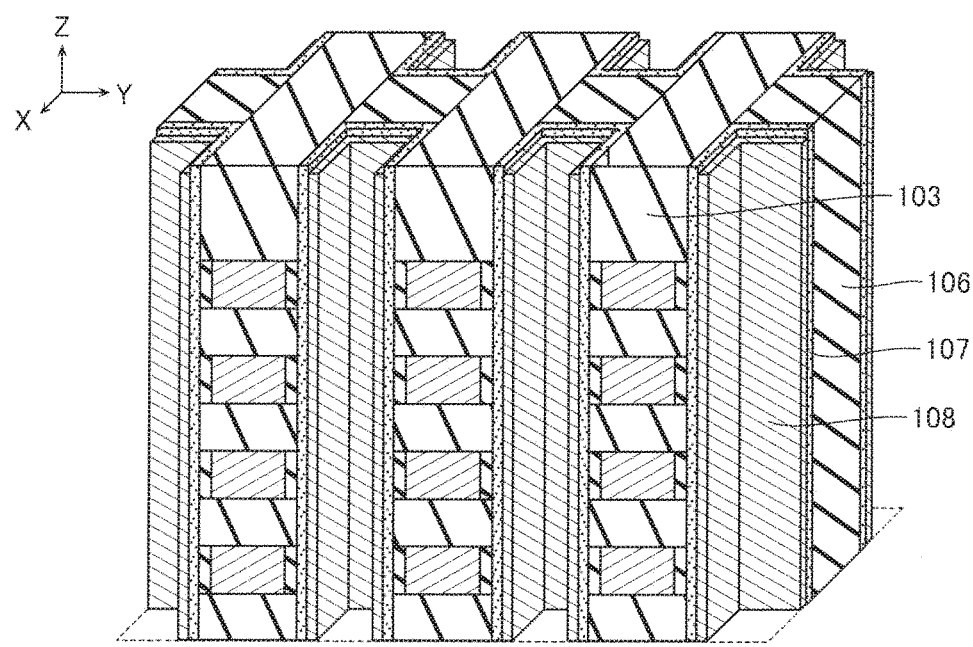

Next, as shown in FIG. 22, upper parts of the conductive film 108 and the variable resistance film 107 are etched back until upper surfaces of the inter-layer insulating film 103 and the insulating film 106 are exposed.

Finally, a conductive film is further implanted in the trench 123 on whose side surface the variable resistance film 107 and the conductive film 108 have been left. This conductive film is formed by a material similar to that of the conductive film 108, and, together with the conductive film 108, functions as the bit line BL.

As a result of the manufacturing steps thus far, the memory cell array 100 shown in FIG. 4 is formed.

The above-described manufacturing steps not only enable the nonlinearity film NLF to be separated on a word line WL basis, but also, as a result of film deposition of the conductive film 108 shown in FIG. 21, enable damage during processing to the variable resistance film 107 (VR) to be kept small. In other words, these manufacturing steps enable deterioration of characteristics of the memory cell MC to be suppressed.

Note that although in the case of the above-described manufacturing steps, the nonlinearity film NLF was formed by implantation of the high permittivity insulating film 104 in the place a102, the nonlinearity film NLF may also be formed by oxidizing the end of the conductive film 102.

Figure 23:
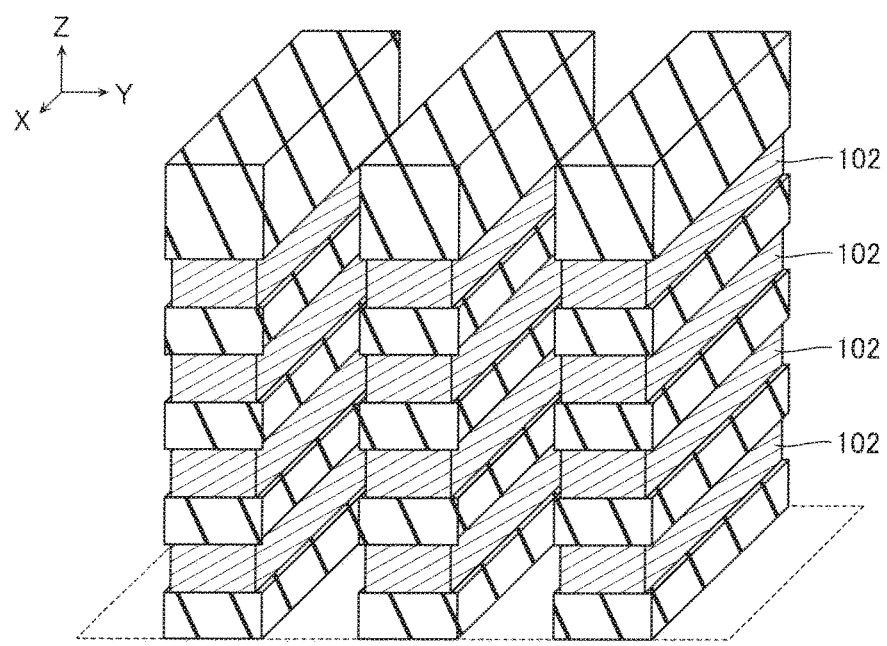
FIG. 23 is another perspective view describing the manufacturing step of the memory cell array of the semiconductor memory device according to the same embodiment.

For example, after forming the trench 121, the end of the conductive film 102 exposed in a side surface of the trench 121 is oxidized. As a result, in the case that the conductive film 102 is formed by titanium nitride (TiN), titanium (Ti) included in the conductive film 102 is oxidized to form the high permittivity insulating film 104 formed by titanium oxide ($TiO_2$). Note that in view of the fact that the end of the conductive film 102 somewhat expands due to the oxidation, the end of the conductive film 102 may be somewhat recessed prior to oxidation, as shown in FIG. 23.

As is clear from the above, the present embodiment makes it possible to provide a semiconductor memory device that reduces leak current between the memory cells arranged in the Z direction while securing nonlinearity of the memory cell.

Second Embodiment

As previously mentioned, the first embodiment enables current leak between the memory cells MC arranged in the Z direction to be suppressed. However, the first embodiment leads to concern about the following point.

Figure 24:
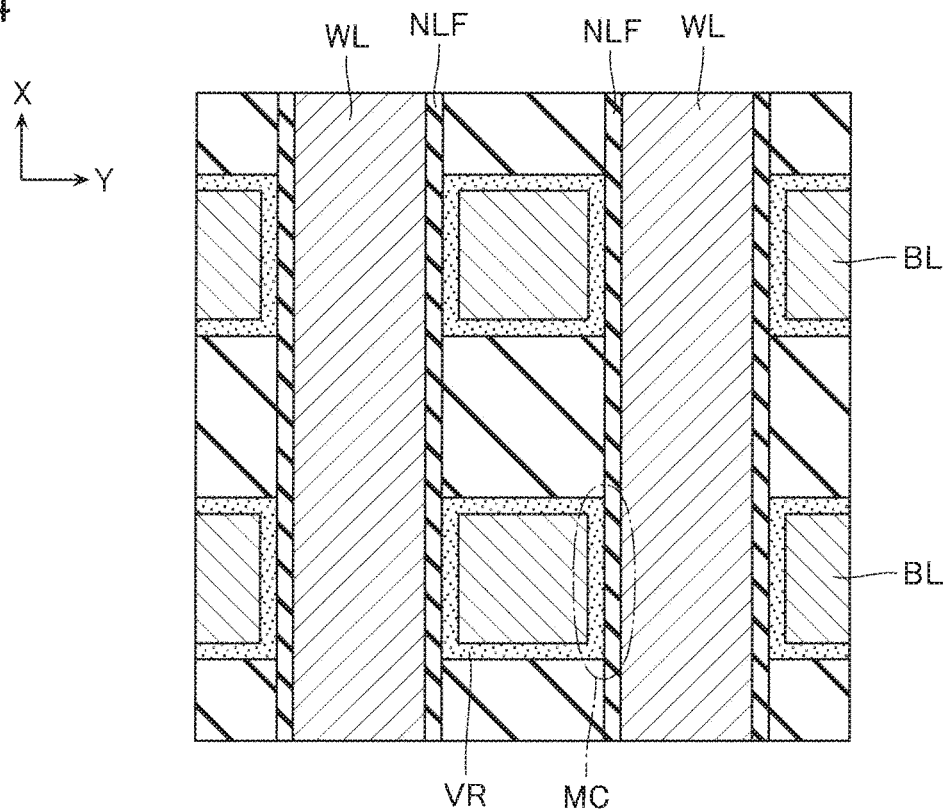
FIG. 24 is a cross-sectional view of the memory cell periphery of the memory cell array of the semiconductor memory device according to the same embodiment.
Figure 25:
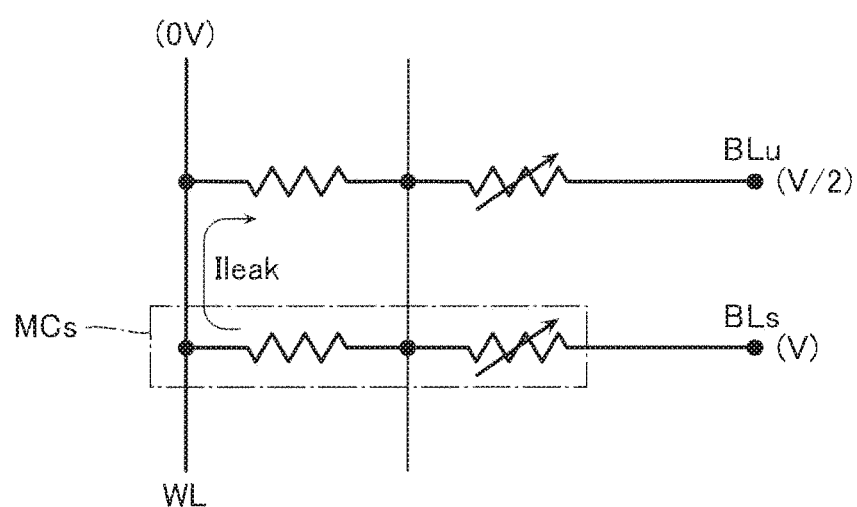
FIG. 25 is an equivalent circuit diagram of the memory cell array of the semiconductor memory device according to the same embodiment.

FIG. 24 is a cross-sectional view in the X-Y directions of the memory cell array of the semiconductor memory device according to the first embodiment; and FIG. 25 is an equivalent circuit diagram of the memory cell array of the same semiconductor memory device.

As shown in FIG. 25, when an access operation is executed on a selected memory cell MCs, a selected word line WL is applied with 0 V, a selected bit line BLs is applied with a certain voltage V, and an unselected bit line BLu is applied with a voltage V/2. In this case, as shown in FIG. 24, if the nonlinearity films NLF of the memory cells MC arranged in the X direction are formed integrally as in the first embodiment, a leak current Ileak flows from the selected bit line BLs toward the unselected bit line BLu via the nonlinearity film NLF. Particularly when the nonlinearity film NLF has been configured as a MIM structure, control of leak current via an intermediate electrode becomes difficult. Moreover, since the word line WL is recessed, a resistance component of the word line WL also ends up increasing.

Accordingly, in the present embodiment, a memory cell array 1 is given the following structure. Hereafter, the memory cell array 1 of the present embodiment will sometimes also be distinguished from another embodiment and be described assigned with a reference symbol 200.

Figure 26:
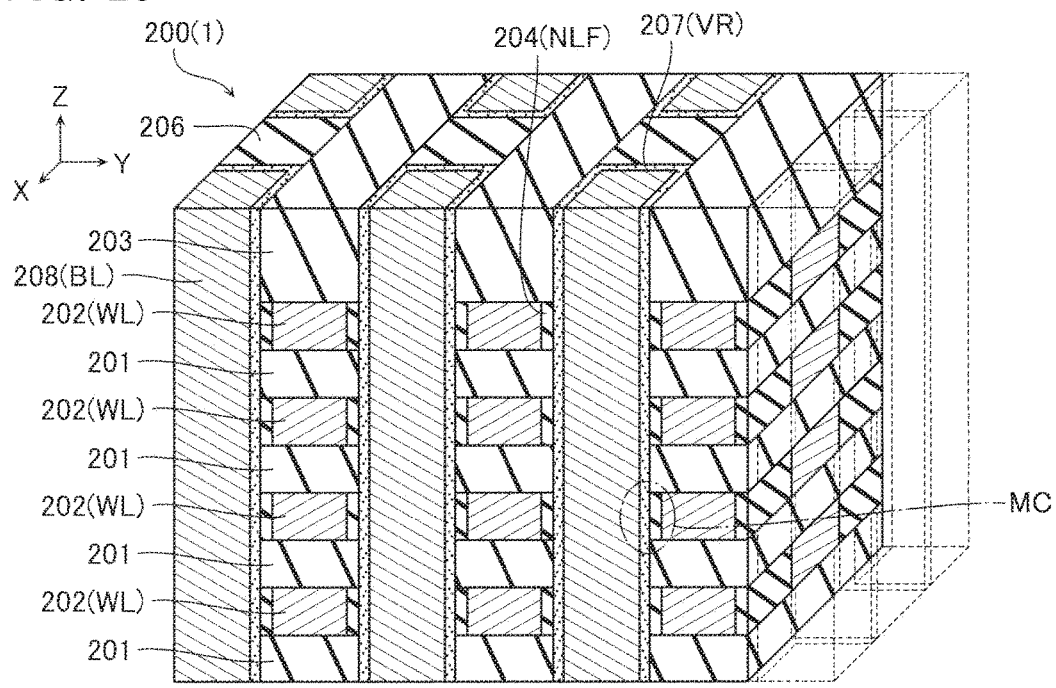
FIG. 26 is a perspective view of a memory cell array of a semiconductor memory device according to a second embodiment.
Figure 27:
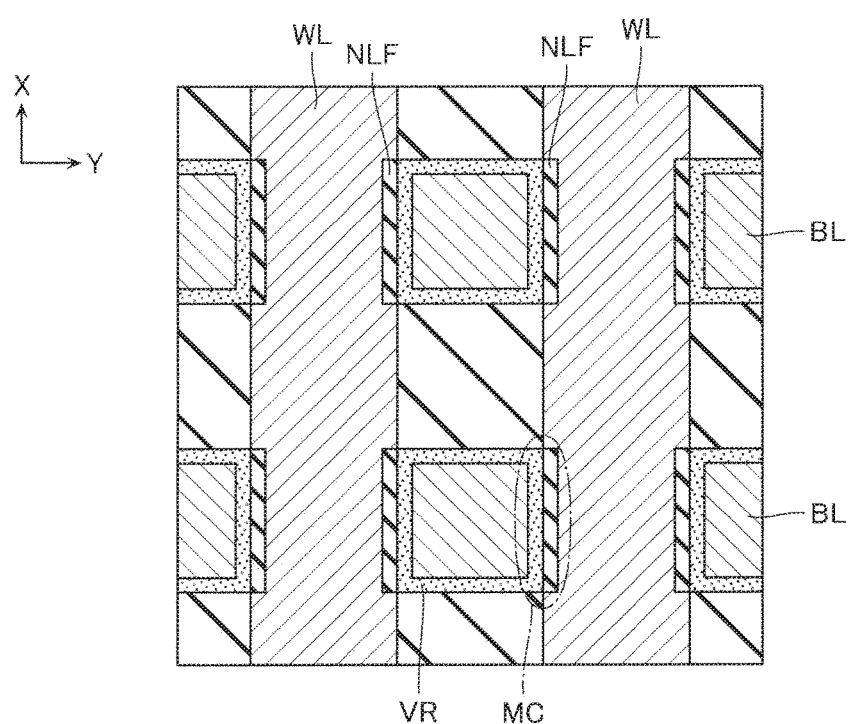
FIG. 27 is a cross-sectional view of a memory cell periphery of the memory cell array of the semiconductor memory device according to the same embodiment.

FIG. 26 is a perspective view of the memory cell array of a semiconductor memory device according to the present embodiment; and FIG. 27 is a cross-sectional view in the X-Y directions of the memory cell array of the same semiconductor memory device.

In the case of the present embodiment, the nonlinearity film NLF is disposed separated at each intersection of the word line WL and the bit line BL. In other words, the nonlinearity film NLF, in addition to being separated between two of the memory cells MC adjacent in the Z direction, is, contrary to in the first embodiment, separated also between two of the memory cells MC adjacent in the X direction. As a result, not only the leak current between the memory cells MC arranged in the Z direction, but also the leak current between the memory cells MC arranged in the X direction can be suppressed. Moreover, since an amount of recessing of the word line WL for disposing the nonlinearity film NLF can be reduced, increase in the resistance component of the word line WL can be more suppressed compared to in the first embodiment.

Next, manufacturing steps of the memory cell array 200 of the present embodiment will be described.

FIGS. 28 to 35 are perspective views describing the manufacturing steps of the memory cell array of the semiconductor memory device according to the present embodiment.

Figure 9:
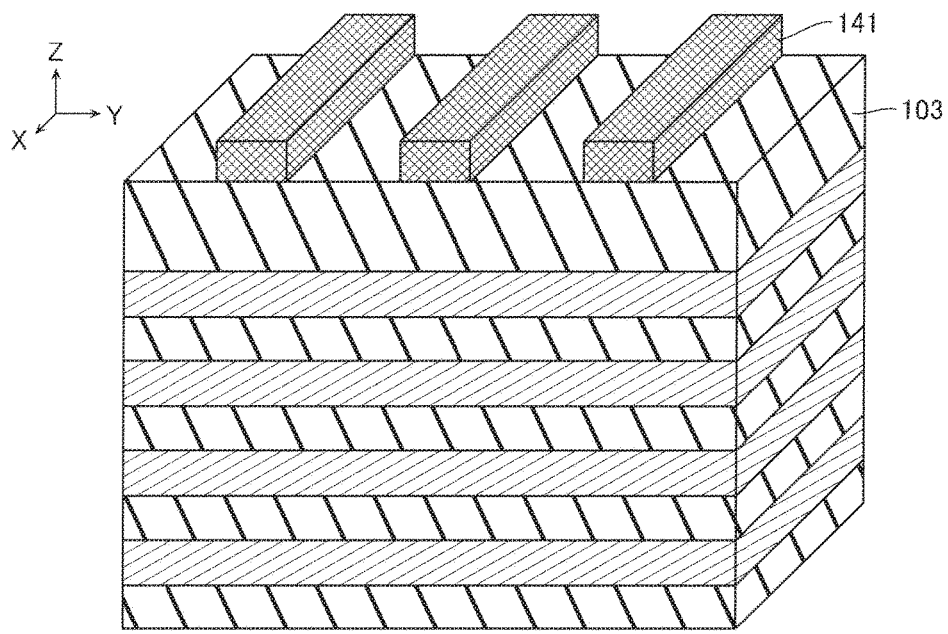

In advance, a plurality of trenches 221 (corresponding to the trenches 121) having the Z direction as their depth direction and having the X direction as their extension direction are formed in a stacked body configured from an inter-layer insulating film 201 (corresponding to the inter-layer insulating film 101), a conductive film 202 (corresponding to the conductive film 102), and an inter-layer insulating film 203, by steps similar to the steps described using FIGS. 8 to 10.

Figure 28:
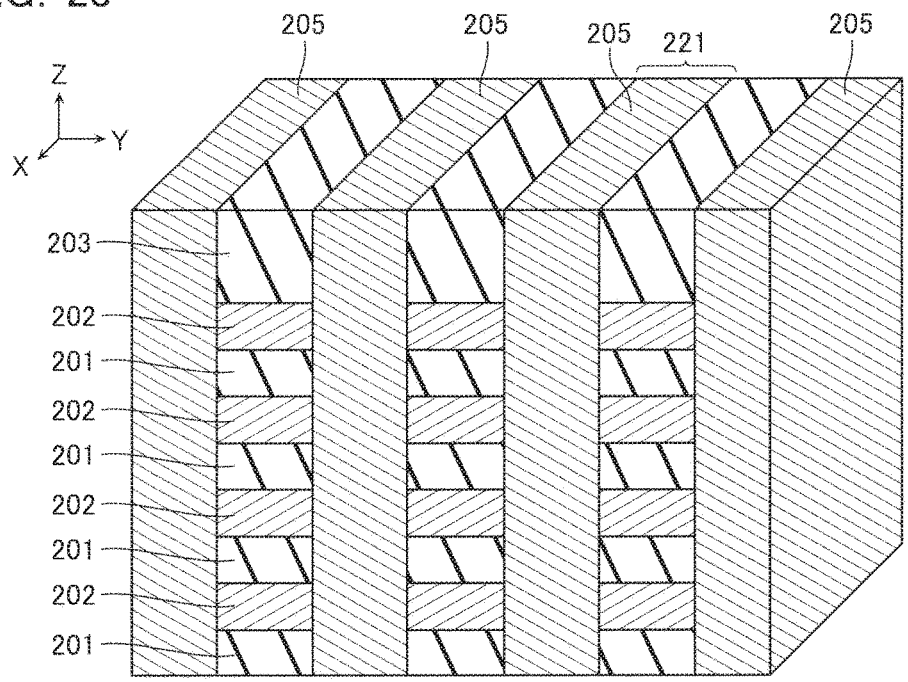
FIGS. 28 to 35 are perspective views describing manufacturing steps of the memory cell array of the semiconductor memory device according to the same embodiment.

Then, as shown in FIG. 28, a conductive film 205 is implanted in the trench 221. Now, the conductive film 205 is formed by polysilicon (Poly-Si), for example.

Figure 29:
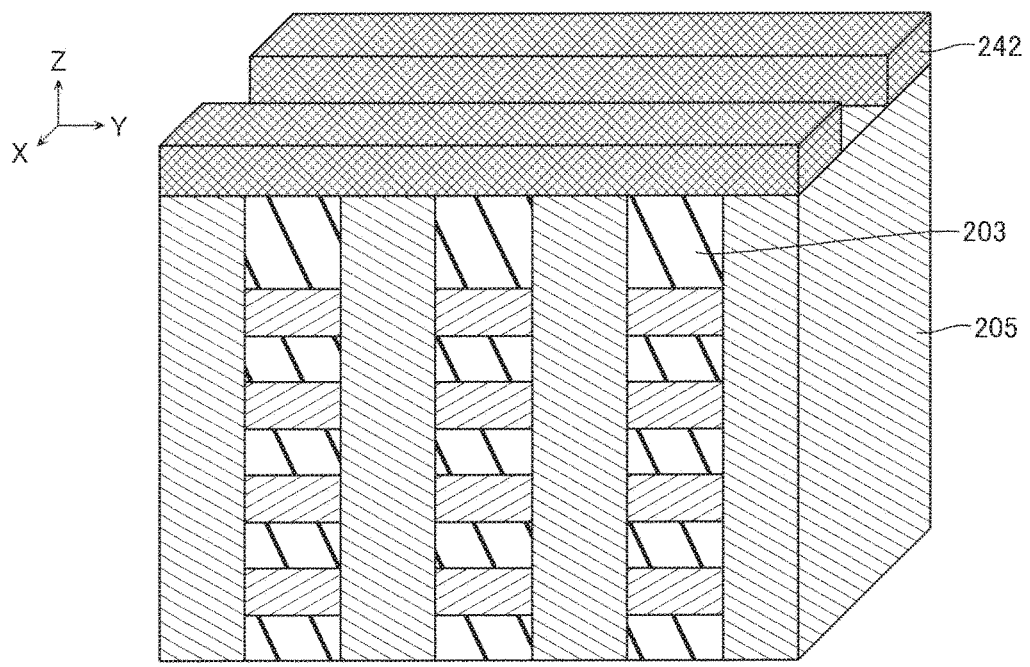

Next, as shown in FIG. 29, a resist film 242 having a pattern of lines/spaces arranged in the X direction for leaving the plurality of bit lines BL, is deposited on the inter-layer insulating film 203 and the conductive film 205.

Figure 30:
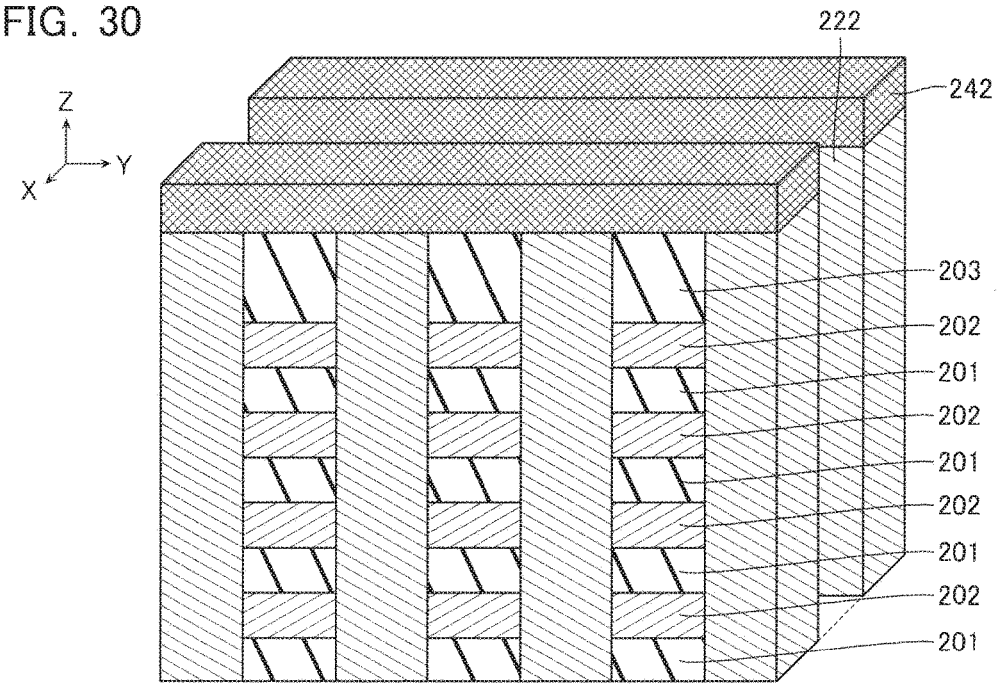

Then, as shown in FIG. 30, a trench 222 is formed in the conductive film 205 not appearing in FIG. 30, from its upper surface to its bottom surface, while leaving the inter-layer insulating film 201, the conductive film 202, and the inter-layer insulating film 203, by anisotropic etching using the resist film 242.

Figure 31:
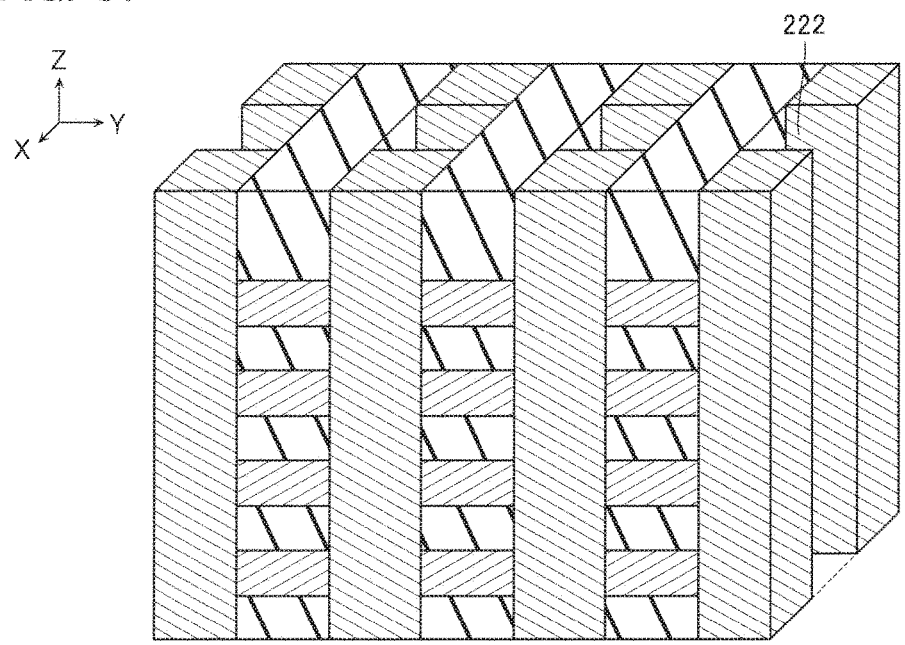

Next, as shown in FIG. 31, the resist film 242 is removed.

Figure 32:
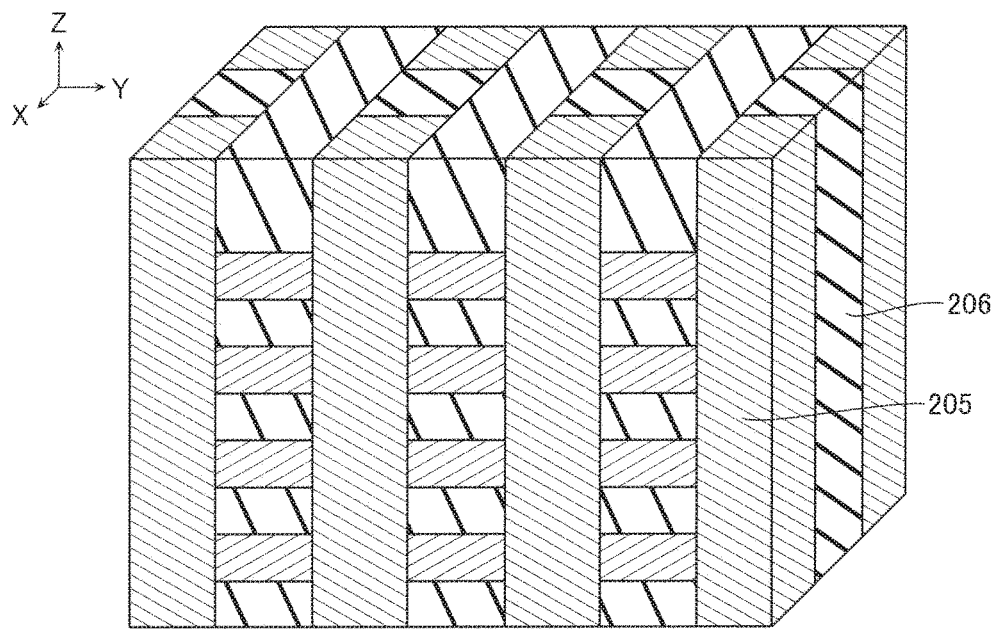

Then, an insulating film 206 is implanted in the trench 222. Next, as shown in FIG. 32, an upper surface of the insulating film 206 undergoes smoothing by CMP, and the conductive film 205 is exposed. Now, the insulating film 206 is formed by silicon oxide ($SiO_2$), for example.

Figure 33:
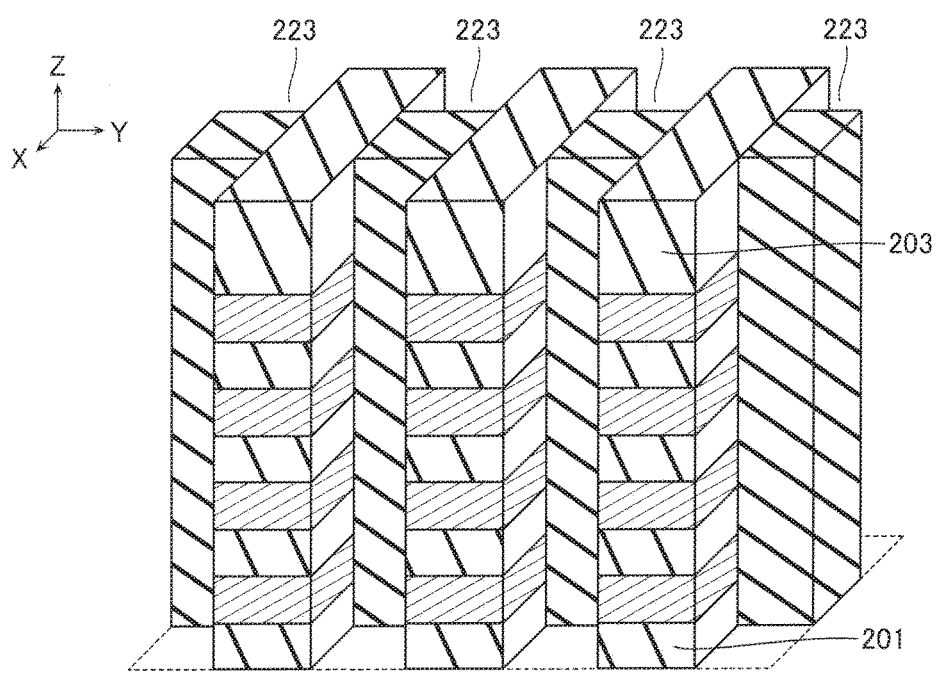

Then, as shown in FIG. 33, the conductive film 205 is removed and a trench 223 reaching from a position of the upper surface of the inter-layer insulating film 203 to a position of the bottom surface of the lowermost layer inter-layer insulating film 201 is formed, by wet etching.

Figure 34:
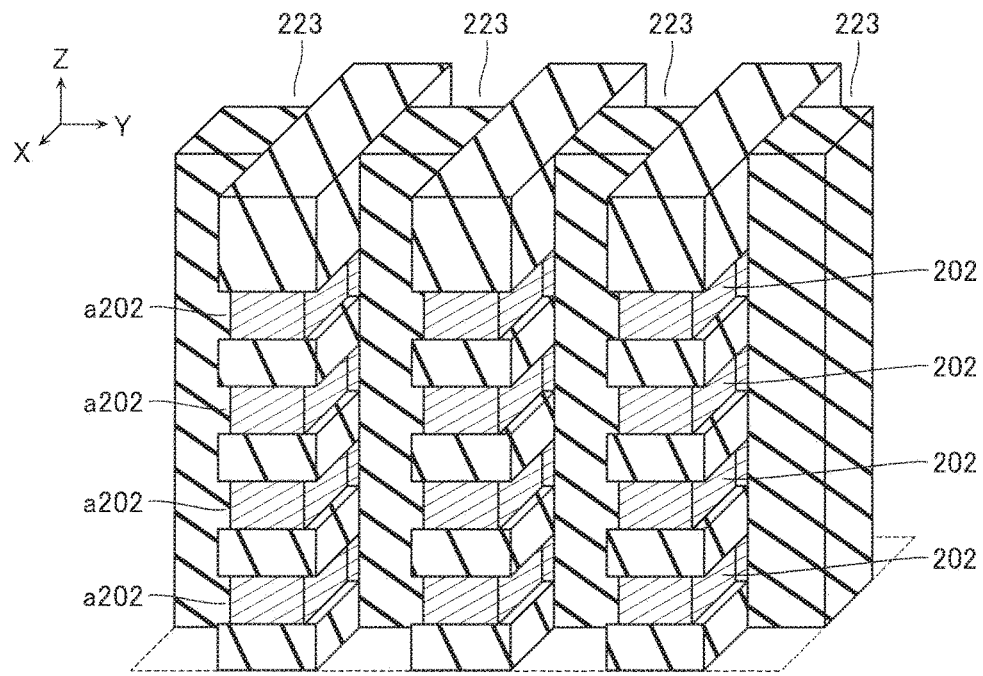

Next, as shown in FIG. 34, an end (a place a202) of the conductive film 202 exposed in the trench 223 is recessed only as much as a film thickness of the nonlinearity film NLF, by isotropic etching via the trench 223.

Figure 35:
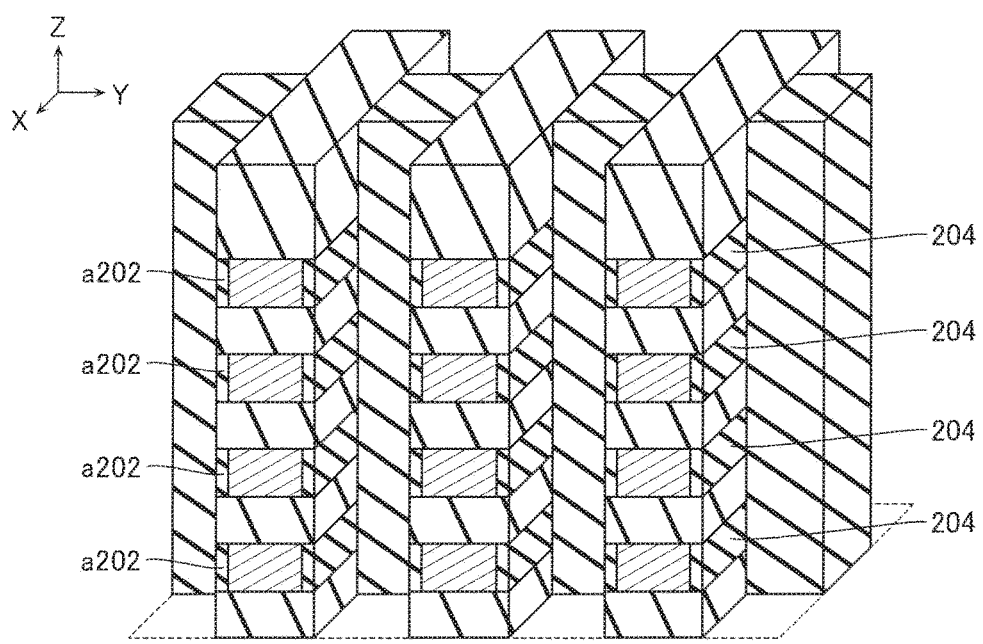

Then, as shown in FIG. 35, a high permittivity insulating film 204 is implanted in the place a202. Now, the high permittivity insulating film 204 is formed by titanium oxide ($TiO_2$), for example, and functions as the nonlinearity film NLF.

Subsequently, steps similar to the steps described using FIGS. 20 to 22 are executed, whereby the memory cell array 200 shown in FIG. 26 is formed.

As is clear from the above, the present embodiment makes it possible to provide a semiconductor memory device that not only can obtain advantages similar to those of the first embodiment, but also reduces leak current between the memory cells arranged in the X direction while suppressing increase in the resistance component of the word line.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate which extends in first and second directions that intersect each other;
   a plurality of first wiring lines which are arranged in a third direction that intersects the first direction and the second direction, and which extend in the first direction;
   a plurality of second wiring lines which are arranged in the first direction and extend in the third direction; and
   a plurality of memory cells disposed at intersections of the first wiring lines and the second wiring lines,
   one of the memory cells including a first film and a second film whose permittivity is different from that of the first film which are stacked in the second direction between one of the first wiring lines and one of the second wiring lines,
   the second films of two of the memory cells adjacent in the third direction being separated between the two memory cells, and
   the second films of two of the memory cells adjacent in the first direction being separated between the two memory cells.

2. The semiconductor memory device according to claim 1, wherein the first film is a variable resistance film.

3. The semiconductor memory device according to claim 1, wherein
the second film has a higher permittivity than the first film.

4. The semiconductor memory device according to claim 1, wherein
the second film is thicker in the second direction than the first film.

5. The semiconductor memory device according to claim 1, further comprising
a first insulating film disposed between two of the first wiring lines adjacent in the third direction,
wherein side surfaces facing a certain second wiring line of the two first wiring lines are more distantly separated from the certain second wiring line in the second direction than a side surface facing the certain second wiring line of the first insulating film is.

6. The semiconductor memory device according to claim 1, further comprising
a first insulating film disposed between two of the first wiring lines adjacent in the third direction,
wherein a side surface facing a certain second wiring line of the second film and a side surface facing the certain second wiring line of the first insulating film are disposed in an identical plane.

7. The semiconductor memory device according to claim 1, wherein the first films of two of the memory cells adjacent in the third direction are integrated.

8. A semiconductor memory device, comprising:
a semiconductor substrate which extends in first and second directions that intersect each other;
a plurality of first wiring lines which are arranged, via a first insulating film, in a third direction that intersects the first direction and the second direction, and which extend in the first direction;
a plurality of second wiring lines which are arranged in the first direction and extend in the third direction; and
a plurality of memory cells disposed at intersections of the first wiring lines and the second wiring lines,
one of the memory cells including a variable resistance film and a second film whose permittivity is higher than that of the variable resistance film which are stacked sequentially in the second direction from a side of one of the second wiring lines between one of the first wiring lines and the one of the second wiring lines,
the second films of two of the memory cells adjacent in the third direction being separated between the two memory cells, and
the second films of two of the memory cells adjacent in the first direction being separated between the two memory cells.

9. The semiconductor memory device according to claim 8, wherein
the second film is a nonlinearity film.

10. The semiconductor memory device according to claim 8, wherein
the second film is thicker in the second direction than the variable resistance film.

11. The semiconductor memory device according to claim 8, wherein
a side surface facing a certain second wiring line of one of the first wiring lines sandwiched by two of the first insulating films adjacent in the third direction is more distantly separated from the certain second wiring line in the second direction than side surfaces facing the certain second wiring line of the two first insulating films are, and
the second film is disposed sandwiched by the two first insulating films, the one first wiring line, and the variable resistance film.

12. The semiconductor memory device according to claim 11, wherein the variable resistance films of two of the memory cells adjacent in the third direction are integrated.

13. A semiconductor memory device, comprising:
a semiconductor substrate which extends in first and second directions that intersect each other;
a plurality of first wiring lines which are arranged alternately, via a first insulating film, in a third direction that intersects the first direction and the second direction, and which extend in the first direction;
a plurality of second wiring lines which are arranged in the first direction and extend in the third direction; and
a plurality of memory cells disposed at intersections of the first wiring lines and the second wiring lines,
one of the memory cells including a first film and a second film whose permittivity is different from that of the first film which are stacked sequentially in the second direction from a side of one of the second wiring lines between one of the first wiring lines and the one of the second wiring lines, and
the second films of two of the memory cells adjacent in the first direction being separated between the two memory cells.

14. The semiconductor memory device according to claim 13, wherein the first film is a variable resistance film.

15. The semiconductor memory device according to claim 14, wherein a side surface facing a certain second wiring line of the second film and a side surface facing the certain second wiring line of one of the first wiring lines at a position between two of the memory cells adjacent in the first direction, are disposed in an identical plane.

16. The semiconductor memory device according to claim 13, wherein the second film has a higher permittivity than the first film.

17. The semiconductor memory device according to claim 13, wherein the second film is thicker in the second direction than the first film.

18. The semiconductor memory device according to claim 13, wherein a width in the second direction of one of the first wiring lines at a position in the first direction of one of the memory cells is less than a width in the second direction of the first wiring line at a position between two of the memory cells adjacent in the first direction.

* * * * *